(12) United States Patent
Hsieh et al.

(10) Patent No.: US 10,269,738 B2
(45) Date of Patent: Apr. 23, 2019

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Cheng-Hsien Hsieh, Kaohsiung (TW); Hsien-Wei Chen, Hsinchu (TW); Chen-Hua Yu, Hsinchu (TW); Tsung-Shu Lin, New Taipei (TW); Wei-Cheng Wu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 4 days.

(21) Appl. No.: 15/935,811

(22) Filed: Mar. 26, 2018

(65) Prior Publication Data
US 2018/0218989 A1 Aug. 2, 2018

Related U.S. Application Data

(62) Division of application No. 14/865,280, filed on Sep. 25, 2015, now Pat. No. 9,929,112.

(51) Int. Cl.
*H01L 23/00* (2006.01)
*H01L 21/56* (2006.01)
(Continued)

(52) U.S. Cl.
CPC .............. *H01L 24/05* (2013.01); *H01L 21/56* (2013.01); *H01L 23/481* (2013.01); *H01L 24/03* (2013.01); *H01L 24/11* (2013.01); *H01L 24/13* (2013.01); *H01L 24/19* (2013.01); *H01L 25/105* (2013.01); *H01L 25/50* (2013.01); *H01L 21/561* (2013.01); *H01L 21/568* (2013.01); *H01L 23/3128* (2013.01); *H01L 23/562* (2013.01); *H01L 2224/0231* (2013.01); *H01L 2224/04105* (2013.01); *H01L 2224/12105* (2013.01); *H01L 2224/32145* (2013.01);
(Continued)

(58) Field of Classification Search
CPC ....................................................... H01L 24/05
See application file for complete search history.

(56) References Cited

U.S. PATENT DOCUMENTS 8,361,842 B2  1/2013  Yu et al.
8,680,647 B2  3/2014  Yu et al.
(Continued)

FOREIGN PATENT DOCUMENTS

KR  20140012689 A  2/2014
KR    101429347 B1  8/2014

*Primary Examiner* — Peniel M Gumedzoe
*Assistant Examiner* — Christopher A Johnson
(74) *Attorney, Agent, or Firm* — Slater Matsil, LLP

(57) ABSTRACT

A redistribution layer with a landing pad is formed over a substrate with one or more mesh holes extending through the landing pad. The mesh holes may be arranged in a circular shape, and a passivation layer may be formed over the landing pad and the mesh holes. An opening is formed through the passivation layer and an underbump metallization is formed in contact with an exposed portion of the landing pad and extends over the mesh holes. By utilizing the mesh holes, sidewall delamination and peeling that might otherwise occur may be reduced or eliminated.

22 Claims, 14 Drawing Sheets

(51) Int. Cl.
  *H01L 23/48*   (2006.01)
  *H01L 25/10*   (2006.01)
  *H01L 25/00*   (2006.01)
  *H01L 23/31*   (2006.01)

(52) U.S. Cl.
  CPC ............... *H01L 2224/32225* (2013.01); *H01L 2224/48227* (2013.01); *H01L 2224/73265* (2013.01); *H01L 2224/73267* (2013.01); *H01L 2224/92244* (2013.01); *H01L 2225/0651* (2013.01); *H01L 2225/06568* (2013.01); *H01L 2225/1023* (2013.01); *H01L 2225/1041* (2013.01); *H01L 2225/1058* (2013.01); *H01L 2924/15311* (2013.01); *H01L 2924/35121* (2013.01)

(56) References Cited

U.S. PATENT DOCUMENTS

| | | | |
|---|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,293,403 B2 | 3/2016 | Park et al. |
| 2007/0290343 A1 | 12/2007 | Harada et al. |
| 2010/0164096 A1 | 7/2010 | Daubenspeck et al. |
| 2011/0291288 A1 | 12/2011 | Wu et al. |
| 2012/0025394 A1* | 2/2012 | Hirano ............... H01L 21/76807 257/774 |
| 2012/0241985 A1 | 9/2012 | Topacio et al. |
| 2013/0009319 A1 | 1/2013 | Shao et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1* | 9/2014 | Hung ................... H01L 23/481 257/774 |
| 2014/0252647 A1 | 9/2014 | Huang et al. |
| 2014/0264930 A1 | 9/2014 | Yu et al. |
| 2014/0291838 A1 | 10/2014 | Chen et al. |
| 2015/0325508 A1* | 11/2015 | Chen ................. H01L 23/49811 361/768 |

* cited by examiner

SEMICONDUCTOR DEVICE AND METHOD OF MANUFACTURE

PRIORITY

This application is a division of U.S. patent application Ser. No. 14/865,280, filed on Sep. 25, 2015, and entitled "Semiconductor Device and Method of Manufacture," which application is incorporated herein by reference.

BACKGROUND

Generally, a semiconductor die may be connected to other devices external to the semiconductor die through a type of packaging utilizing solder bumps. The solder bumps may be formed by initially forming a layer of underbump metallization in contact with a conductive portion of the semiconductor die and then placing solder onto the underbump metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like.

However, the material that comprises the underbump metallization is merely one more type of material placed onto a stack of many different materials, such as dielectric materials, metallization materials, etch stop materials, barrier layer materials, and other materials utilized in the formation of the semiconductor die. Each one of these different materials may have a unique coefficient of thermal expansion that is different from the other materials. This type of coefficient of thermal expansion mismatch causes each one of the materials to expand a different distance when the semiconductor die is heated during later processing, testing or use. As such, at elevated temperatures there is a coefficient of thermal expansion mismatch that causes stresses to form between the different materials and, hence, the different parts of the semiconductor die. If not controlled, these stresses can cause delamination to occur between the various layers of material, especially when the materials used include copper and a low-k dielectric layer. This delamination can damage or even destroy the semiconductor die during the manufacturing process or else during its intended use.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
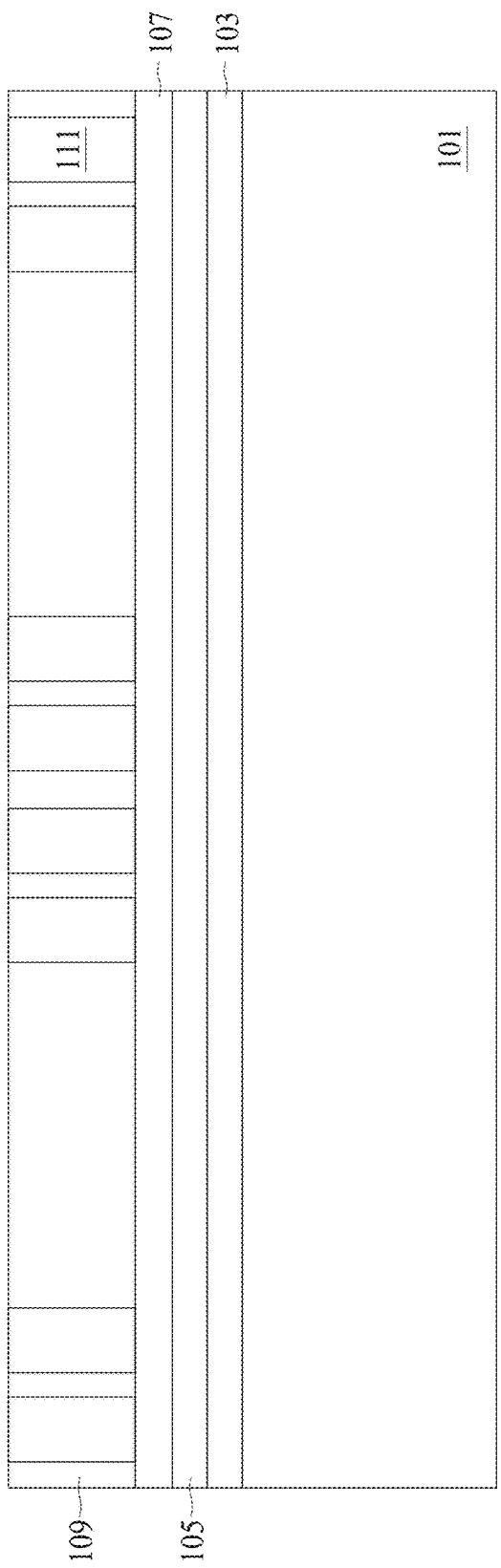
FIG. 1 illustrates formation of through vias, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a carrier substrate 101 with an adhesive layer 103, a polymer layer 105, and a first seed layer 107 over the carrier substrate 101. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2A-3).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, Solder Resistance (SR), or Ajinomoto build-up film (ABF) may alternatively be utilized. The polymer layer 105 may be placed using, e.g., a spin-coating process to a thickness of between about 2 μm and about 15 μm, such as about 5 μm, although any suitable method and thickness may alternatively be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 μm and about 1 μm, such as about 0.5 μm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 μm and about 250 μm, such as about 120 μm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may alternatively be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
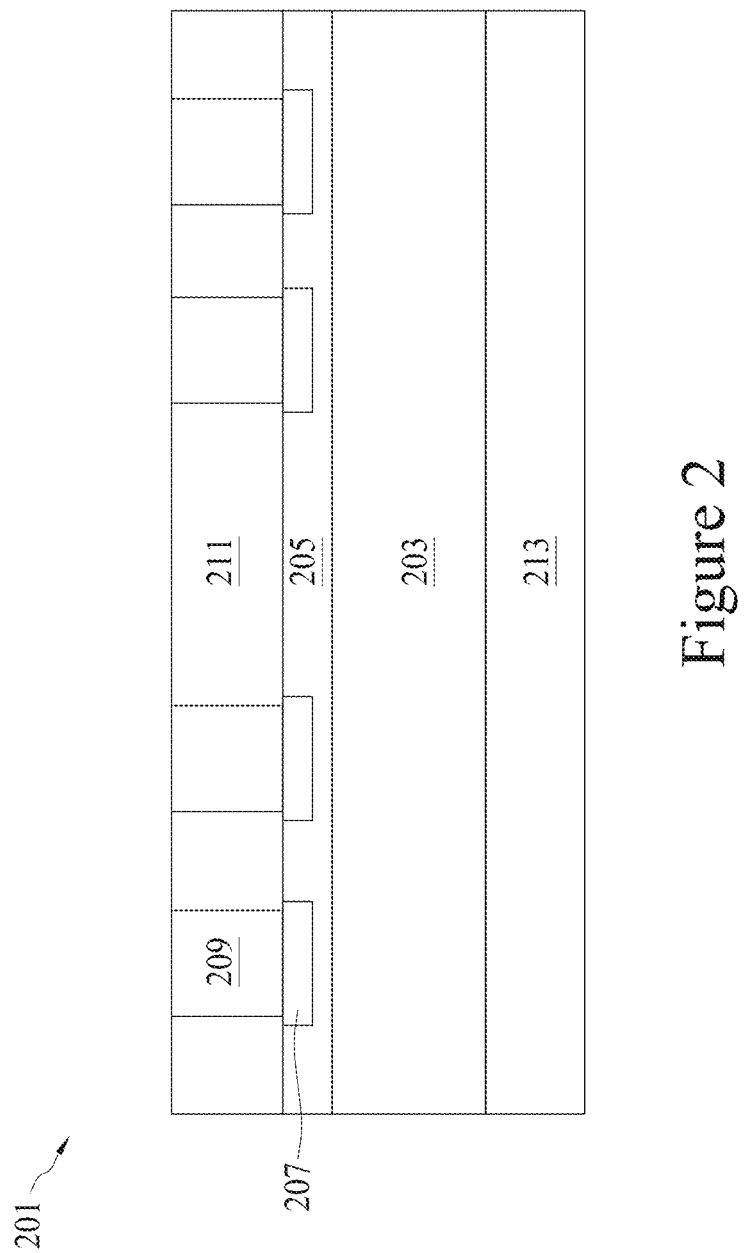
FIG. 2 illustrates embodiments of a first semiconductor device, in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 µm and about 5 µm, such as about 9.25 KÅ.

The first external connectors 209 may be formed to provide conductive regions for contact between the first contact pads 207 and, e.g., a first redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layers through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

On an opposite side of the first substrate 203 than the first metallization layers 205, a die attach film (DAF) 217 may be formed in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
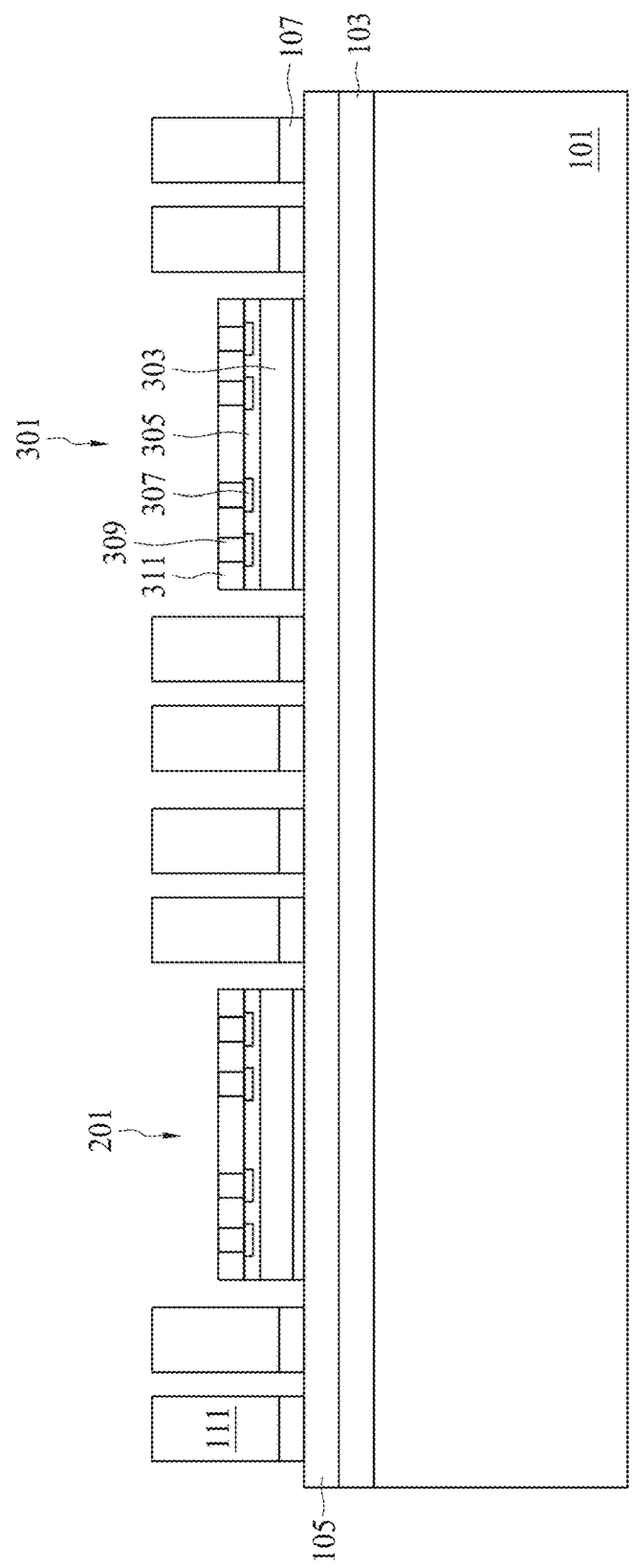
FIG. 3 illustrates a placement of the first semiconductor device between the through vias, in accordance with some embodiments.

FIG. 3 illustrates a placement of the first semiconductor device 201 onto the polymer layer 105 along with a placement of a second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other alternative method of placing the first semiconductor device 201 and the second semiconductor device 301.

Figure 4:
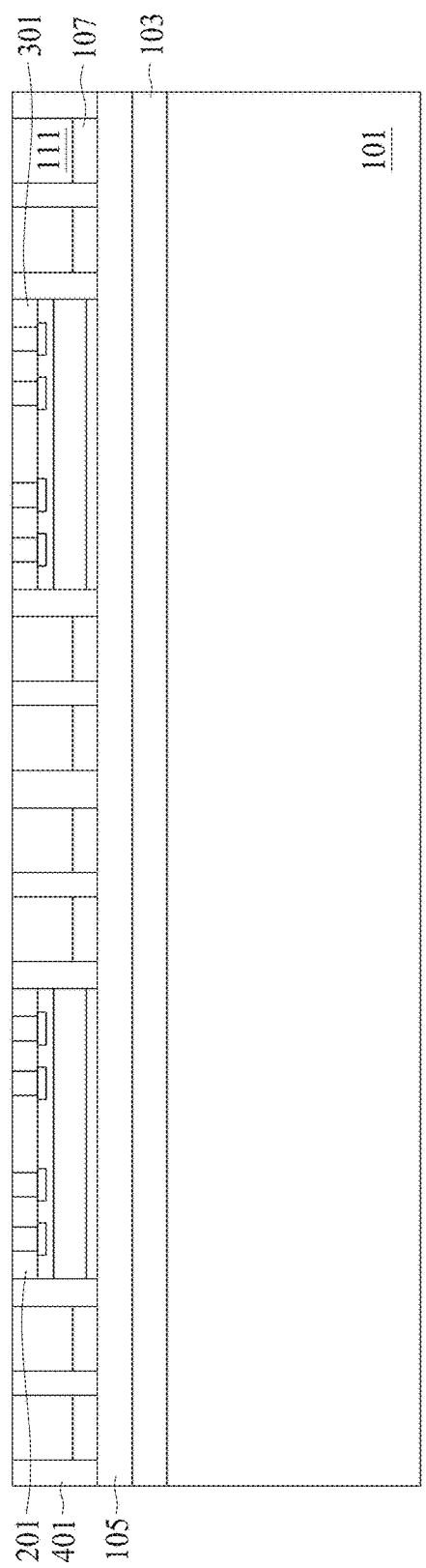
FIG. 4 illustrates an encapsulation of the first semiconductor device and through vias, in accordance with some embodiments.

FIG. 4 illustrates an encapsulation of the vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the carrier substrate 101, the vias 111, the first semiconductor device 201, and the second semiconductor device 301.

During the encapsulation process the top molding portion may be placed adjacent to the bottom molding portion, thereby enclosing the carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also planar with the encapsulant 401.

However, while the CMP process described above is presented as one illustrative embodiment, it is not intended to be limiting to the embodiments. Any other suitable removal process may alternatively be used to thin the encapsulant 401, the first semiconductor device 201, and the second semiconductor device 301 and expose the vias 111. For example, a series of chemical etches may be utilized. This process and any other suitable process may alternatively be utilized to thin the encapsulant 401, the first semiconductor device 201, and the second semiconductor device 301, and all such processes are fully intended to be included within the scope of the embodiments.

Optionally, after the encapsulant 401 has been thinned, the vias 111, the first external connectors 209, and the second external connectors 309 may be recessed within the encapsulant 401. In an embodiment the vias 111, the first external connectors 209, and the second external connectors 309 may be recessed using, e.g., an etching process that utilizes an etchant that is selective to the material of the vias 111, the first external connectors 209, and the second external connectors 309 (e.g., copper). The vias 111, the first external connectors 209, and the second external connectors 309 may be recessed to a depth of between about 20 µm and about 300 µm, such as about 180 µm.

Figure 5:
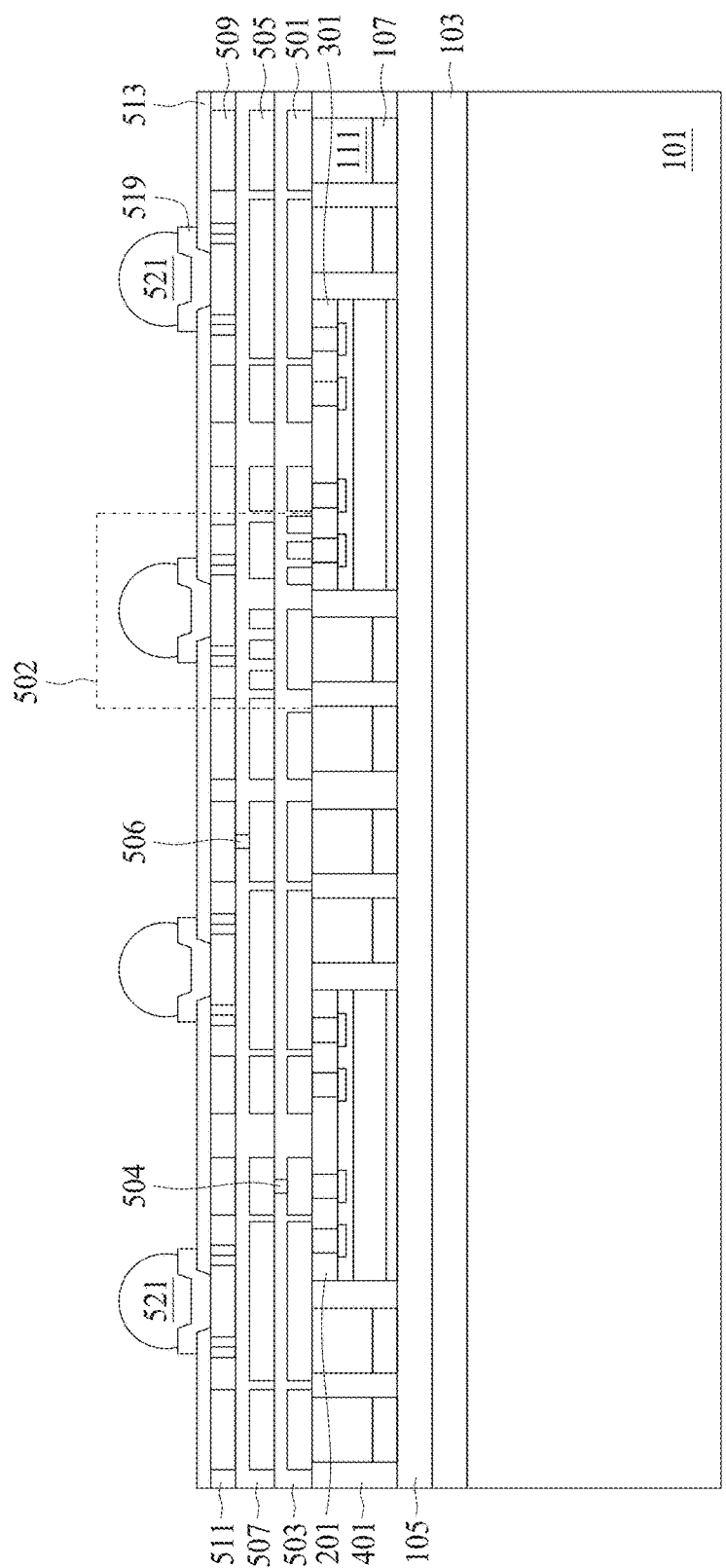
FIG. 5 illustrates formation of redistribution layers and external connections, in accordance with some embodiments.
Figure 6:
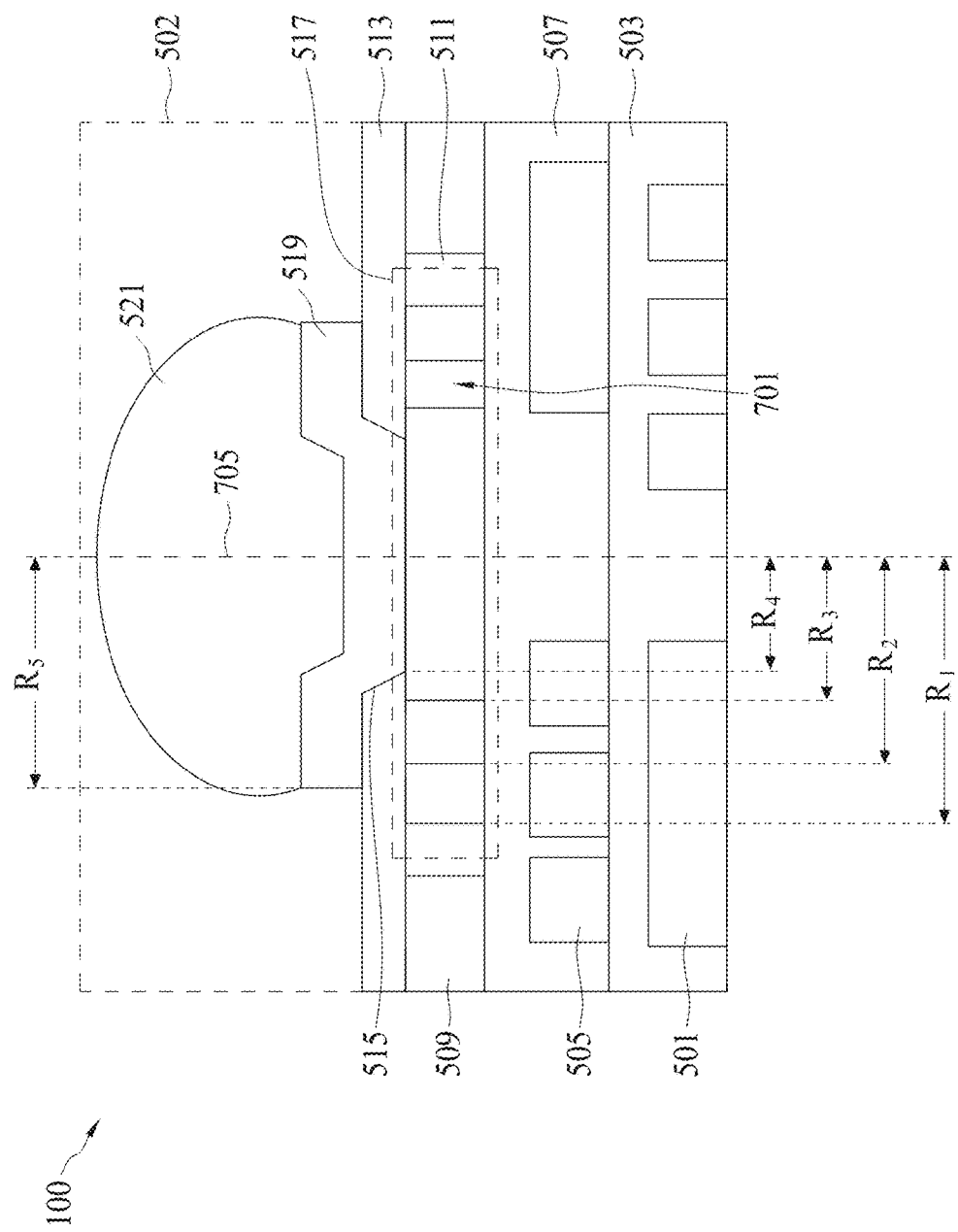
FIG. 6 illustrates a cross-sectional, close up view of a third redistribution layer with a landing pad and mesh holes in accordance with some embodiments.

FIGS. 5-6 illustrate cross-sectional views of a formation of a first redistribution layer (RDL) 501, a second redistribution layer 505, and a third redistribution layer 509 in order to interconnect the first semiconductor device 201, the second semiconductor device 301, the vias 111 and third external connection 521 (with FIG. 6 illustrating a close-up view of the region surrounded by dashed line 502 in FIG. 5). In an embodiment the first redistribution layer 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 501 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5 also illustrates a formation of a third passivation layer 503 over the first redistribution layer 501 in order to provide protection and isolation for the first redistribution layer 501 and the other underlying structures. In an embodiment the third passivation layer 503 may be polybenzoxazole (PBO), although any suitable material, such as polyimide or a polyimide derivative, may alternatively be utilized. The third passivation layer 503 may be placed using, e.g., a spin-coating process to a thickness of between about 5 µm and about 25 µm, such as about 7 µm, although any suitable method and thickness may alternatively be used.

After the third passivation layer 503 has been formed, first openings 504 (only one of which is illustrated in FIG. 5 for clarity) may be made through the third passivation layer 503 by removing portions of the third passivation layer 503 to expose at least a portion of the underlying first redistribution layer 501. The first openings 504 allows for contact between the first redistribution layer 501 and a second redistribution layer 505 (described further below). The first openings 504 may be formed using a suitable photolithographic mask and etching process, although any suitable process to expose portions of first redistribution layer 501 may alternatively be used.

The second redistribution layer 505 may be formed to provide additional routing and connectivity and in electrical connection with the first redistribution layer 501. In an embodiment the second redistribution layer 505 may be formed similar to the first redistribution layer 501. For example, a seed layer may be formed, a photoresist may be placed and patterned on top of the seed layer, and conductive material may be plated into the patterned openings through the photoresist. Once formed, the photoresist may be removed, the underlying seed layer may be etched, the second redistribution layer 505 may be covered by a fourth passivation layer 507 (which may be similar to the third passivation layer 503), and the fourth passivation layer 507 may be patterned to form second openings 506 (only one of which is illustrated in FIG. 5 for clarity) and expose an underlying conductive portion of the second redistribution layer 505.

The third redistribution layer 509 may be formed to provide additional routing along with electrical connection between the second redistribution layer 505 and the third external connection 521. In an embodiment the third redistribution layer 509 may be formed using materials and processes similar to the first redistribution layer 501. For example, a seed layer may be formed, a photoresist may be placed and patterned on top of the seed layer in a desired pattern for the third redistribution layer 509, conductive material is plated into the patterned openings of the photoresist, the photoresist is removed, and the seed layer is etched.

However, in addition to simply rerouting the electrical connections (similar to the second redistribution layer 505), the third redistribution layer 509 may also comprise a landing pad (illustrated in FIG. 6 being surrounded by dashed line 517) that will be utilized to form an electrical connection to, e.g., an overlying underbump metallization (UBM) 519 (described further below). The landing pad 517 may be shaped (as described further below in greater detail with respect to FIG. 7) in order to make suitable physical and electrical connection with the UBM 519 and the third external connection 521.

Once the third redistribution layer 509 has been formed, the third redistribution layer 509 may be covered by a fifth passivation layer 511. The fifth passivation layer 511, similar to the third passivation layer 503, may be formed from a polymer such as PBO, or may be formed of a similar material as the third passivation layer 503 (e.g., polyimide or a polyimide derivative). The fifth passivation layer 511 may be formed to have a thickness of between about 2 µm and about 15 µm, such as about 5 µm.

Once in place over the third redistribution layer 509, the fifth passivation layer 511 may be planarized with the third redistribution layer 509. In an embodiment the planarization may be performed using, e.g., a chemical mechanical polishing process, whereby etchants and abrasives are utilized along with a rotating platen in order to chemically and mechanically remove portions of the fifth passivation layer 511 until the fifth passivation layer 511 is planar with the third redistribution layer 509. However, any suitable planarization process, such as a series of one or more etches or a mechanical grinding process, may alternatively be utilized.

Figure 7:
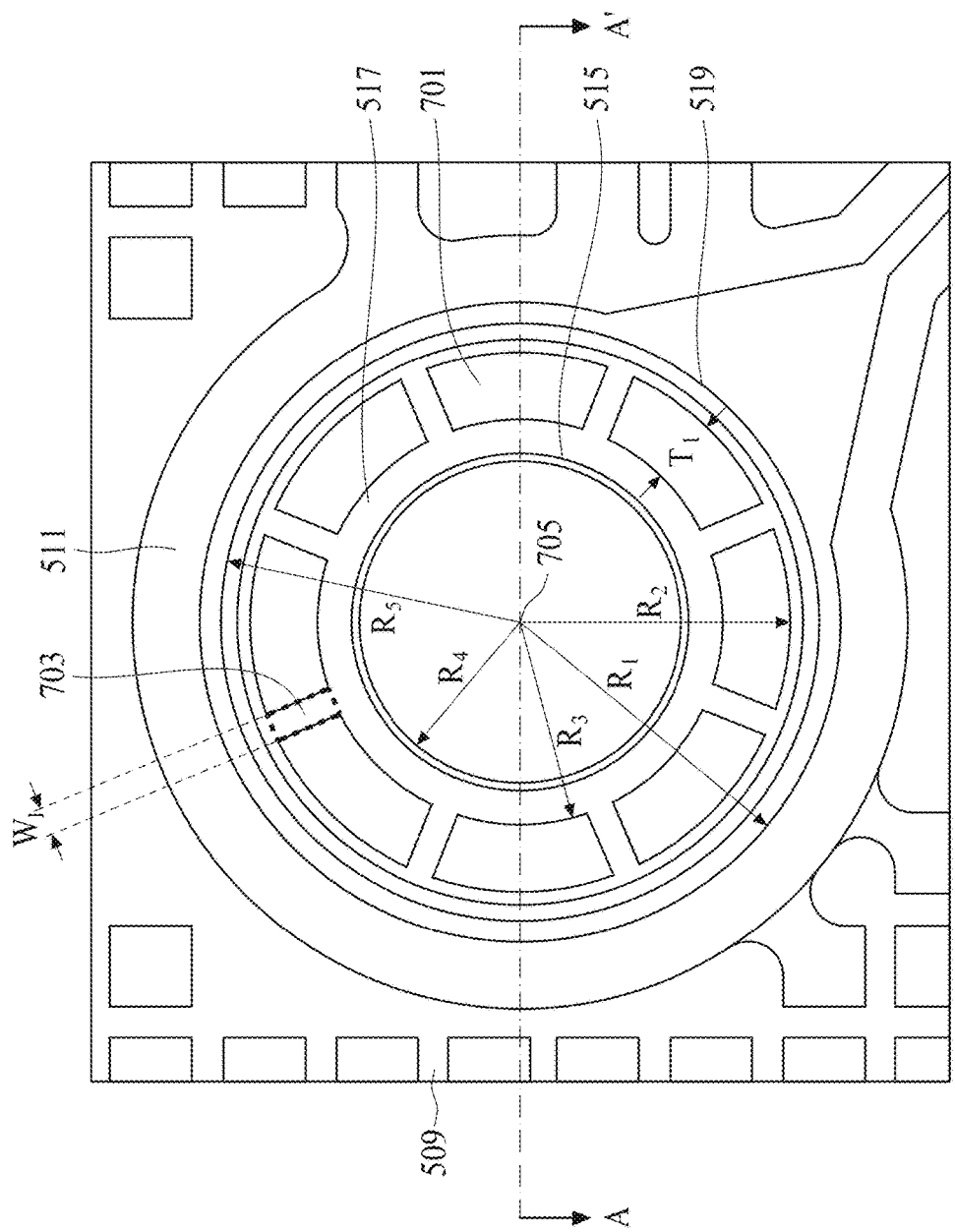
FIG. 7 a top down view of the landing pad and mesh holes in accordance with some embodiments.

FIG. 7 illustrates a top down view of one embodiment in which the third redistribution layer 509 is manufactured with mesh holes 701 through the third redistribution layer 509 in order to reduce high sidewall peeling stresses and cracks that may otherwise accumulate along the sidewalls of the landing pad 517 of the third redistribution layer 509 during thermal cycle tests, further processing, or operation. Once formed, the mesh holes 701 are filled with the dielectric material of the fifth passivation layer 511. In this figure, the cross sectional view illustrated in FIG. 6 is illustrated by the line labeled A-A'.

As can be seen in FIG. 7, the third redistribution layer 509 has a landing pad 517 to provide connectivity to a UBM 519. In an embodiment the landing pad 517 has a circular shape and is separated from other portions of the third redistribution layer 509 (those portions that in some embodiments provide routing functionality) by the material of the fifth passivation layer 511. In an embodiment the landing pad 517 may have a first radius $R_1$ (relative to a center 705 of the landing pad 517) of between about 210 µm and about 240 µm, such as about 230 µm. However, any suitable radius, and any other desired shape, may be used to form the landing pad 517.

Within the borders of landing pad 517, the mesh holes 701 are formed. In an embodiment in which the third redistribution layer 509 is formed using a seed layer, a patterned photoresist, and a plating process, the mesh holes 701 may be formed by simply not removing the photoresist in those areas where the mesh holes 701 are desired. In this way, the mesh holes 701 within the landing pad 517 are formed along with the rest of the landing pad 517, and no additional processing is utilized.

In another embodiment, the landing pad 517 may be formed as a solid material and the mesh holes 701 may be formed after the formation of the remainder of the landing pad 517. In this embodiment a photolithographic masking and etching process may be utilized, whereby a photoresist is placed and patterned over the landing pad 517 after the landing pad 517 has been formed and one or more etching processes is utilized to remove those portions of the landing pad 517 where the mesh holes 701 are desired. Any suitable process may be utilized to form the mesh holes 701.

In an embodiment the mesh holes 701 may be arranged as portions of a discontinuous circle located adjacent to the outer circumference of the landing pad 517. In this embodiment the mesh holes 701 in the circle may collectively have an outer radius such as a second radius $R_2$ that is between about 170 µm and about 200 µm, such as about 190 µm, and may also collectively have an inner radius such as a third radius $R_3$ of between about 120 µm and about 190 µm, such as about 170 µm. However, any suitable dimensions may be used. With the second radius $R_2$ and the third radius $R_3$, the mesh holes 701 may have a first thickness $T_1$ that is a difference of the third radius $R_3$ and the second radius $R_2$ of between about 10 µm and about 50 µm, such as about 20 µm.

Additionally, in order to make sure that the outer portions of the landing pad 517 (that portion located that is located on the outside of the circular shape formed by the mesh holes 701) remain physically and electrically connected to the central portion (that portion located that is located on the interior of the circular shape formed by the mesh holes 701), the mesh holes 701 are separated from each other by a connecting portion 703 of the landing pad 517 that comprises the conductive material of the landing pad 517. In an embodiment the connecting portion 703 is formed to extend between the mesh holes 701 and has a first width $W_1$ of between about 10 µm and about 50 µm, such as greater than about 10 µm. However, any suitable dimension may alternatively be used.

By forming the landing pad 517 with the mesh holes 701, the landing pad 517 is better able to withstand the stresses that are involved with the semiconductor manufacturing, testing, and operating processes. In particular, the mesh holes 701 may be utilized to reduce or eliminate delamination or peeling that may occur along the sidewalls of the landing pad 517. Such reduction or prevention of delamination and peeling will help prevent defects and increase the overall yield of a semiconductor manufacturing process.

Returning now to FIGS. 5 and 6, after the third redistribution layer 509 has been formed with the mesh holes 701, a sixth passivation layer 513 may be formed over the third redistribution layer 509 and the mesh holes 701 in order to protect the third redistribution layer 509 and other underlying structures. In an embodiment the sixth passivation layer 513, similar to the third passivation layer 503, may be formed from a polymer such as PBO, or may be formed of a similar material as the third passivation layer 503 (e.g., polyimide or a polyimide derivative). The sixth passivation layer 513 may be formed to have a thickness of between about 2 µm and about 15 µm, such as about 5 µm.

After the sixth passivation layer 513 has been formed, a third opening 515 may be made through the sixth passivation layer 513 by removing portions of the sixth passivation layer 513 to expose at least a portion of the underlying landing pad 517. The third opening 515 allows for contact between the landing pad 517 and the UBM 519. The third opening 515 may be formed using a suitable photolithographic mask and etching process, although any suitable process to expose portions of the landing pad 517 may be used.

In an embodiment the third opening 515 may be formed to have a radius at a bottom of the third opening 515 that is less than the third radius $R_3$ so that the third opening 515 exposes conductive material of the landing pad 517 and does not expose the mesh holes 701. As such, in an embodiment the third opening 515 may have a fourth radius $R_4$ of between about 50 µm and about 110 µm, such as about 100 µm. However, any suitable dimension may be used.

Once the landing pad 517 has been exposed through the sixth passivation layer 513, the UBM 519 may be formed in electrical contact with the landing pad 517 through the sixth passivation layer 513. The UBM 519 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 519. Any suitable materials or layers of material that may be used for the UBM 519 are fully intended to be included within the scope of the current application.

The UBM 519 may be created by forming each layer over the sixth passivation layer 513 and along the interior of the third opening 515 through the sixth passivation layer 513. The forming of each layer may be performed using a plating process, such as electrochemical plating, although other processes of formation, such as sputtering, evaporation, or PECVD process, may alternatively be used depending upon the desired materials. The UBM 519 may be formed to have a thickness of between about 0.7 µm and about 10 µm, such as about 5 µm. Once the desired layers have been formed, portions of the layers may then be removed through a suitable photolithographic masking and etching process to remove the undesired material and to leave the UBM 519 in a desired shape, such as a circular, octagonal, square, or rectangular shape, although any desired shape may alternatively be formed.

The UBM 519 may also be formed to extend over and beyond the mesh holes 701. In one particular embodiment the UBM 519 is formed to extend beyond the mesh holes 701 and to have a sidewall that is directly over the outer portion of the landing pad 517 (beyond the mesh holes 701). As such, the UBM 519 may have a fifth radius $R_5$ that is greater than the second radius $R_2$ and less than the first radius $R_1$, such as by being between about 180 µm and about 230 µm, such as about 210 µm. However, any suitable distance may be used.

The third external connection 521 may be utilized to provide an external connection point for electrical connection to the third redistribution layer 509 and may be, for example, a contact bump, although any suitable connection may be utilized. In an embodiment in which the third external connection 521 is a contact bump, the third external connection 521 may comprise a material such as tin, or other suitable materials, such as silver, lead-free tin, or copper. In an embodiment in which the third external connection 521 is a tin solder bump, the third external connection 521 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape.

By forming the mesh holes 701 within the landing pad 517 portion of the third redistribution layer 509, the dielectric of the fifth passivation layer 511 may be utilized as a buffer in order to absorb at least some of the stresses that are generated during subsequent manufacturing, testing, and operating processes. By absorbing at least some of these stresses, the mesh holes 701 may be used to reduce the delamination and peeling that may occur along the sidewalls of the landing pad 517, thereby preventing defects and increasing the reliability as well as the manufacturing yield for the semiconductor devices that incorporate the mesh holes 701.

Figure 8:
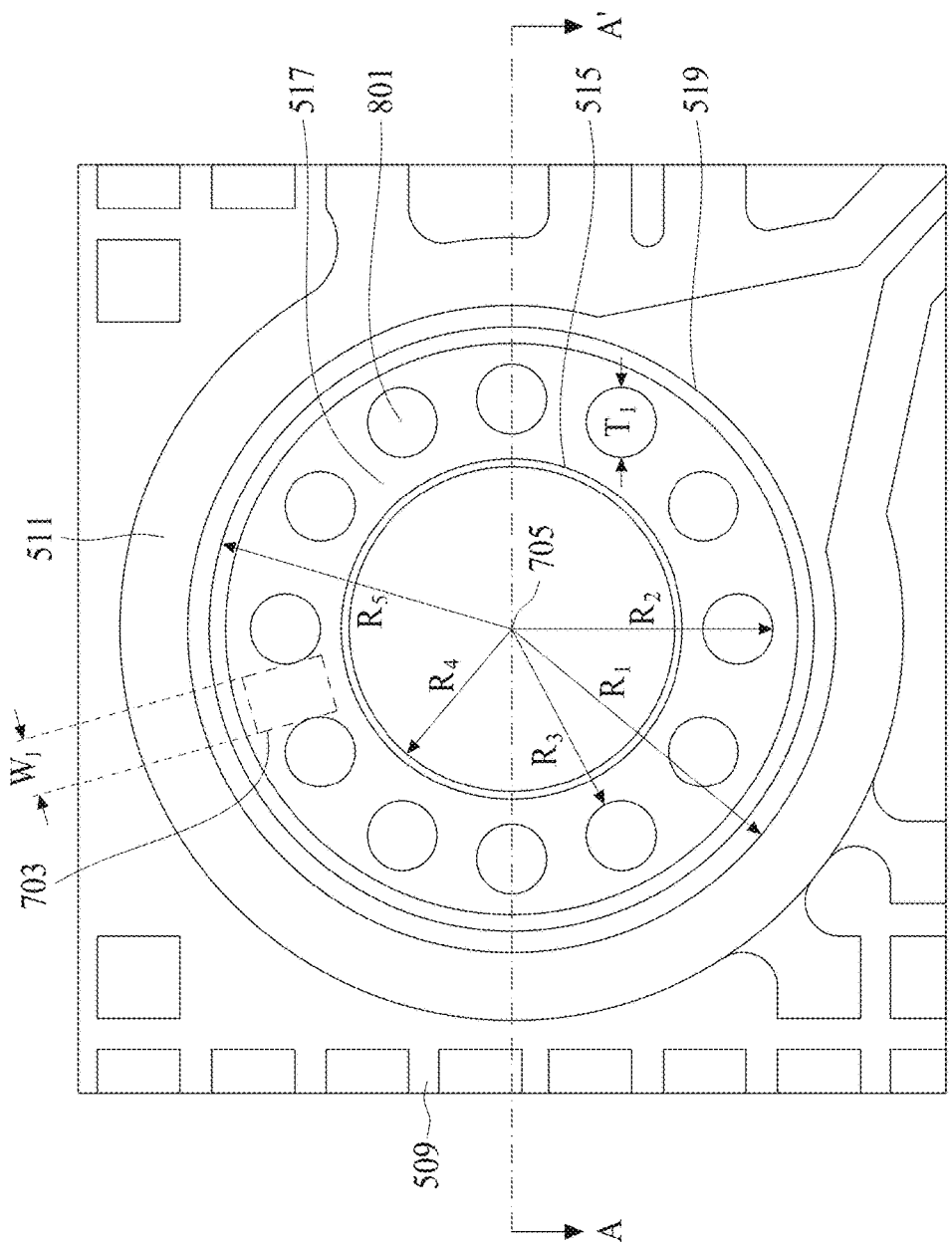
FIG. 8 illustrates a cross-sectional view of circular mesh holes in accordance with some embodiments.

FIG. 8 illustrates another embodiment in which the mesh holes 701, instead of being formed as separate sections of a circular shape (as described above with respect to FIG. 7), are each individually shaped as circular mesh holes 801. In this embodiment each of the circular mesh holes 801 have a diameter that is equal to the first thickness $T_1$, such as by having a diameter of between about 10 µm and about 50 µm, such as about 20 µm. Additionally, the circular mesh holes 801 may be spaced apart from each other by the first width $W_1$ of between about 10 µm and about 50 µm, such as about 20 µm. However, any suitable dimensions and placements may be utilized.

In an embodiment the circular mesh holes 801 are arranged such that the furthermost point of the individual circular mesh holes 801 (relative to a center of the landing pad 517) are at the second radius $R_2$. Additionally, with the furthestmost point of the individual circular mesh holes 801 at the second radius $R_2$, the innermost point of the individual circular mesh holes 801 (relative to the center of the landing pad 517) are at the third radius $R_3$, thereby arranging the individual circular mesh holes 801 into a larger circular shape. However, any suitable placement may be utilized.

Figure 9:
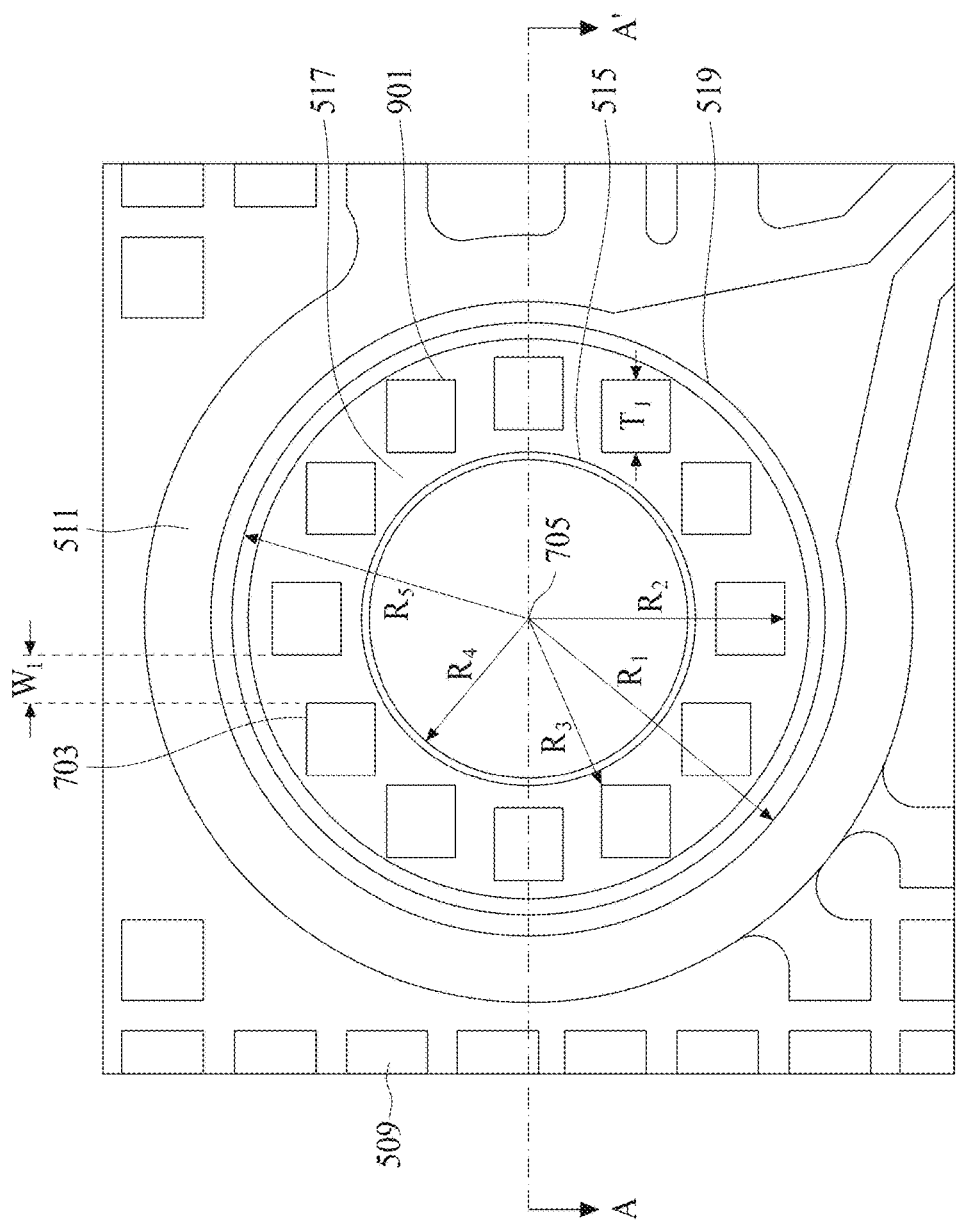
FIG. 9 illustrates a cross-sectional view of square mesh holes in accordance with some embodiments.

FIG. 9 illustrates another embodiment in which the mesh holes 701, instead of being formed as separate sections of a circular shape (as described above with respect to FIG. 7) or as individual circular mesh holes 801 (as described above with respect to FIG. 8), are each shaped as rectangular mesh holes 901. In this embodiment each of the rectangular mesh holes 901 have a dimension that is equal to the first thickness $T_1$, such as by having a dimension of between about 10 µm and about 50 µm, such as about 20 µm. Additionally, the rectangular mesh holes 901 may be spaced apart from each other by the first width $W_1$ of between about 10 µm and about 50 µm, such as about 20 µm. However, any suitable dimensions may be utilized.

In an embodiment the rectangular mesh holes 901 may be arranged such that the furthermost point of the individual rectangular mesh holes 901 (relative to a center of the landing pad 517) are at the second radius $R_2$. Additionally, with the furthestmost point of the rectangular mesh holes 901 at the second radius $R_2$, the innermost point of the individual rectangular mesh holes 901 (relative to the center of the landing pad 517) are at the third radius $R_3$, thereby arranging the rectangular mesh holes 901 into a larger circular shape. However, any suitable placement may be utilized.

Figure 10:
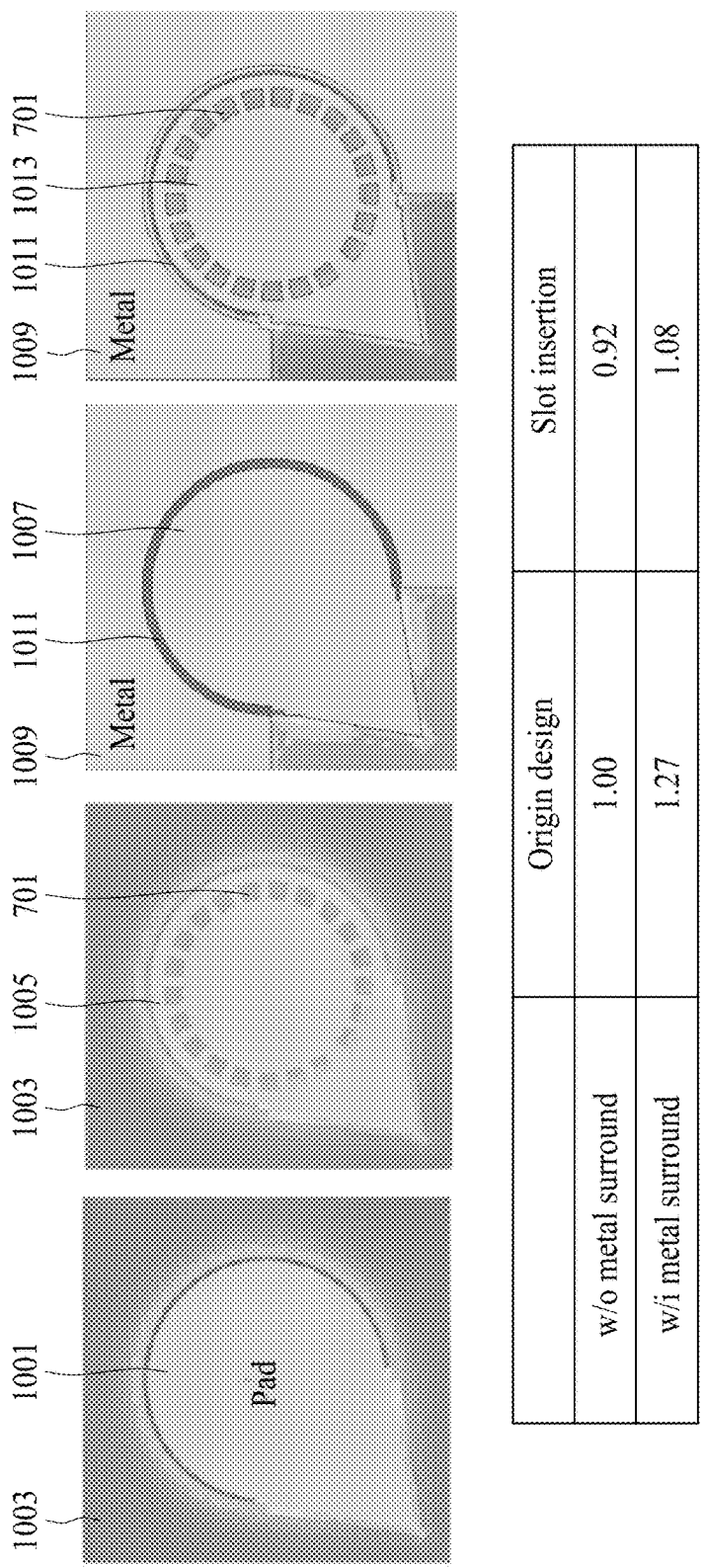
FIG. 10 illustrates simulation data illustrating a reduction in stress achieved by the inclusion of the mesh holes in accordance with some embodiments.

FIG. 10 illustrates a table of normalized simulation data (using a quarter package model and TCB1000 (CLR TCB) modeling conditions) that illustrates that the placement of the mesh holes 701 within the landing pad 517 reduces the sidewall stresses that may be induced by copper and passivation layer shrinking. In a first test (and using a first landing pad 1001 surrounded by a surrounding dielectric material 1003 such as PBO as a normalized 1.00 amount of stress), the inclusion of the mesh holes 701 within a second landing pad 1005 will reduce the amount of stress to 92% of the original stress without the mesh holes 701.

Similarly, in an embodiment in which a third landing pad 1007 is surrounded by a metal 1009 (although separated by a dielectric 1011 such as PBO) such as copper instead of the dielectric material, the inclusion of the mesh holes 701 into a fourth landing pad 1013 will reduce the stresses from a 1.27 (normalized to the first landing pad 1001 without the mesh holes 701 and surrounded by the surrounding dielectric material 1003) to 1.08. As such, the inclusion of the mesh holes 701 creates a reduction in stresses which will also lead to a reduction in delamination and peeling, leading to a higher yield and more reliable product.

Figure 11:
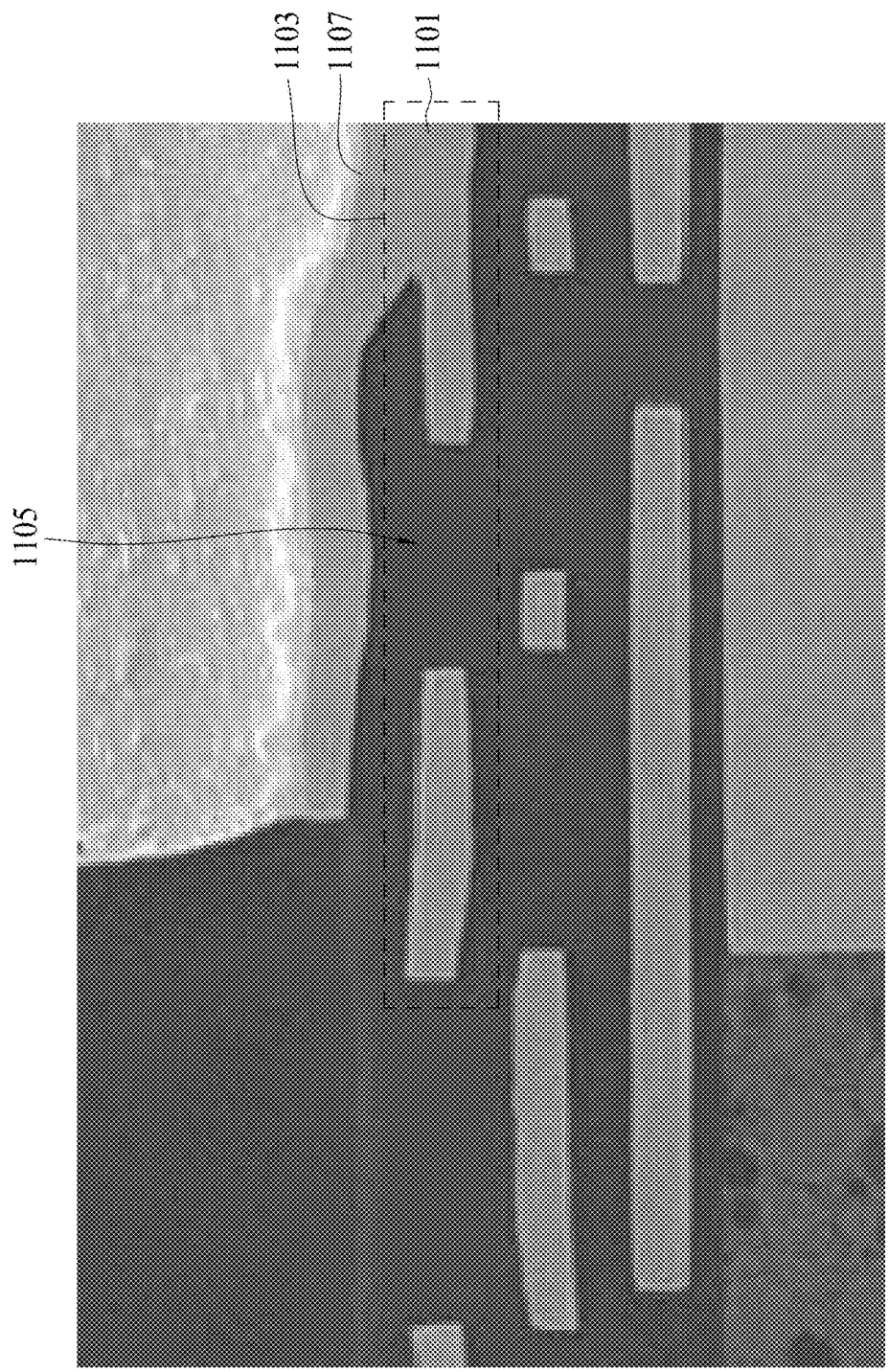
FIG. 11 illustrates a structure with no delamination or cracks in accordance with some embodiments.

FIG. 11 illustrates a picture of an actual redistribution layer 1101 with an actual landing pad 1103 and actual mesh holes 1105 in contact with an actual UBM 1107. As can be seen, there are no cracks or sidewall delamination along the sidewalls of the actual landing pad 1103. Such prevention of cracks and delamination can improve yield and performance.

Figure 12:
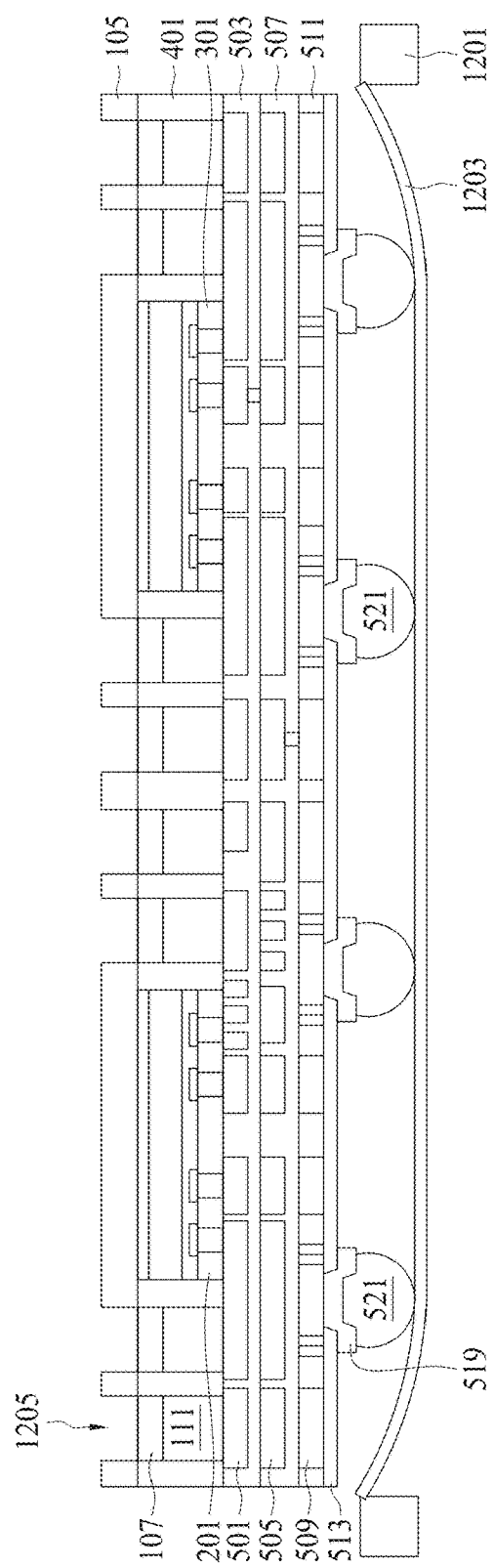
FIG. 12 illustrates a debonding of the carrier wafer in accordance with some embodiments.

FIG. 12 illustrates a debonding of the carrier substrate 101 from the first semiconductor device 201 and the second semiconductor device 301. In an embodiment the third external connection 521 and, hence, the structure including the first semiconductor device 201 and the second semiconductor device 301, may be attached to a ring structure 1201. The ring structure 1201 may be a metal ring intended to provide support and stability for the structure during and after the debonding process. In an embodiment the third external connection 521, the first semiconductor device 201, and the second semiconductor device 301 are attached to the ring structure using, e.g., a ultraviolet tape 1203, although any other suitable adhesive or attachment may alternatively be used.

Once the third external connection 521 and, hence, the structure including the first semiconductor device 201 and the second semiconductor device 301 are attached to the ring structure 1201, the carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the third external connection 521, the first semiconductor device 201, and the second semiconductor device 301.

FIG. 12 additionally illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 12) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form fourth openings 1205 over the vias 111 to have a width of between about 100 μm and about 300 μm, such as about 200 μm.

In another embodiment, the polymer layer 105 may be patterned by initially applying a photoresist (not individually illustrated in FIG. 12) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 13:
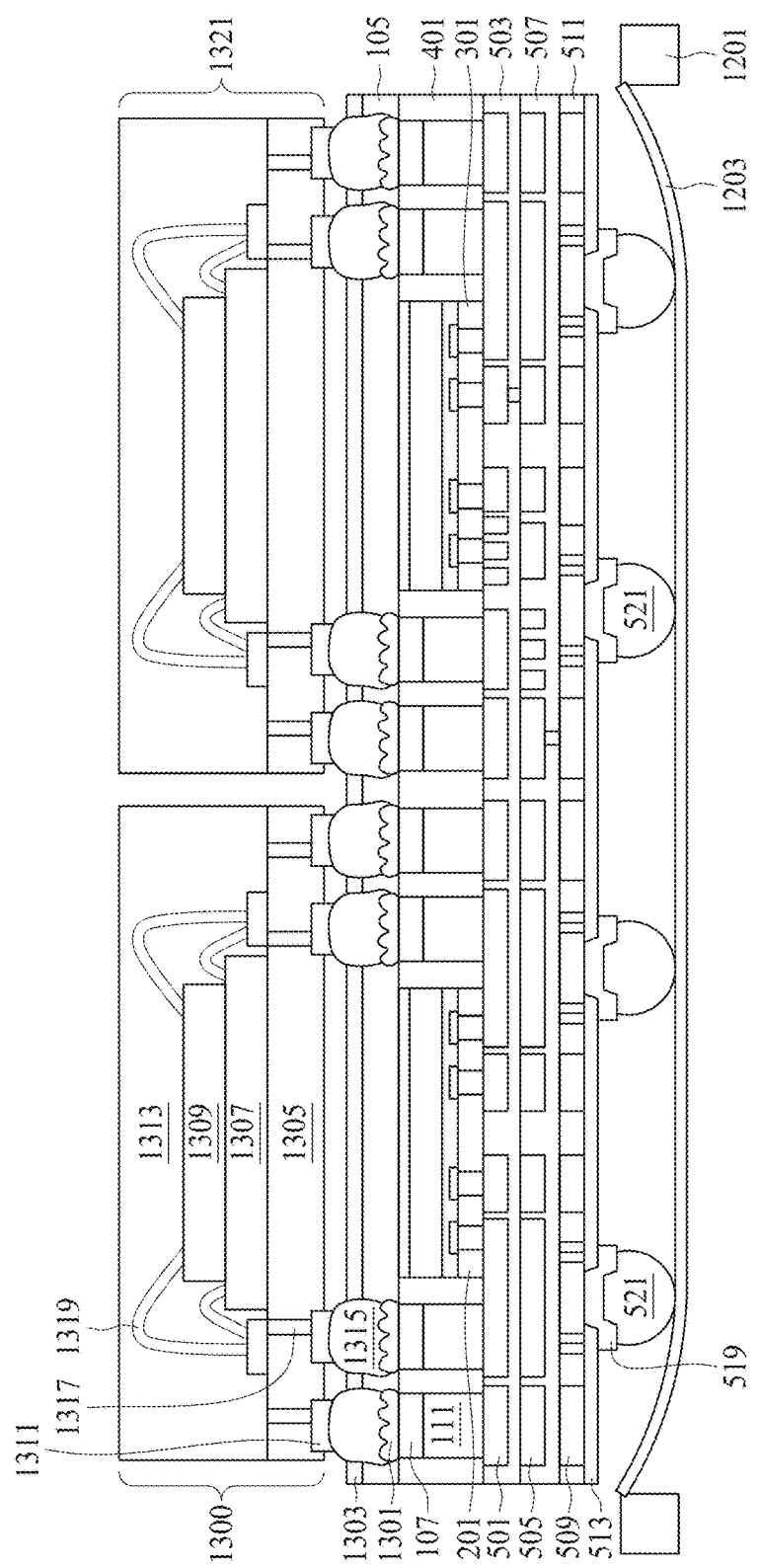
FIG. 13 illustrates a bonding of a first package and a second package in accordance with some embodiments.

FIG. 13 illustrates a placement of a backside ball pad 1301 within the fourth openings 1205 in order to protect the now exposed vias 111. In an embodiment the backside ball pads 1301 may comprise a conductive material such as solder on paste or an oxygen solder protection (OSP), although any suitable material may alternatively be utilized. In an embodiment the backside ball pads 1301 may be applied using a stencil, although any suitable method of application may alternatively be utilized, and then reflowed in order to form a bump shape.

FIG. 13 also illustrates a placement and patterning of a backside protection layer 1303 over the backside ball pads 1301, effectively sealing the joint between the backside ball pads 1301 and the vias 111 from intrusion by moisture. In an embodiment the backside protection layer 1303 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 1303 may be applied using a process such as screen printing, lamination, spin coating, or the like, to a thickness of between about 1 μm to about 200 μm.

FIG. 13 also illustrates that, once the backside protection layer 1303 has been placed, the backside protection layer 1303 may be patterned in order to expose the backside ball pads 1301. In an embodiment the backside protection layer 1303 may be patterned using, e.g., a laser drilling method, by which a laser is directed towards those portions of the backside protection layer 1303 which are desired to be removed in order to expose the backside ball pads 1301. During the laser drilling process the drill energy may be in a range from 0.1 mJ to about 30 mJ, and a drill angle of about 0 degree (perpendicular to the backside protection layer 1303) to about 85 degrees to normal of the backside protection layer 1303. In an embodiment the exposure may form openings with a diameter of between about 30 μm and about 300 μm, such as about 150 μm.

In another embodiment, the backside protection layer 1303 may be patterned by initially applying a photoresist (not individually illustrated in FIG. 13) to the backside protection layer 1303 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 1303 are removed with, e.g., a dry etch process. However, any other suitable method for patterning the backside protection layer 1303 may be utilized.

FIG. 13 also illustrates a bonding of the backside ball pads 1301 to a first package 1300. In an embodiment the first package 1300 may comprise a third substrate 1305, a third semiconductor device 1307, a fourth semiconductor device 1309 (bonded to the third semiconductor device 1307), third contact pads 1311, a second encapsulant 1313, and fourth external connections 1315. In an embodiment the third substrate 1305 may be, e.g., a packaging substrate comprising internal interconnects (e.g., through substrate vias 1317) to connect the third semiconductor device 1307 and the fourth semiconductor device 1309 to the backside ball pads 1301.

Alternatively, the third substrate 1305 may be an interposer used as an intermediate substrate to connect the third semiconductor device 1307 and the fourth semiconductor device 1309 to the backside ball pads 1301. In this embodiment the third substrate 1305 may be, e.g., a silicon substrate, doped or undoped, or an active layer of a silicon-on-insulator (SOI) substrate. However, the third substrate 1305 may alternatively be a glass substrate, a ceramic substrate, a polymer substrate, or any other substrate that may provide a suitable protection and/or interconnection functionality. These and any other suitable materials may alternatively be used for the third substrate 1305.

The third semiconductor device 1307 may be a semiconductor device designed for an intended purpose such as being a logic die, a central processing unit (CPU) die, a memory die (e.g., a DRAM die), combinations of these, or the like. In an embodiment the third semiconductor device 1307 comprises integrated circuit devices, such as transistors, capacitors, inductors, resistors, first metallization layers (not shown), and the like, therein, as desired for a particular functionality. In an embodiment the third semiconductor device 1307 is designed and manufactured to work in conjunction with or concurrently with the first semiconductor device 201.

The fourth semiconductor device 1309 may be similar to the third semiconductor device 1307. For example, the fourth semiconductor device 1309 may be a semiconductor device designed for an intended purpose (e.g., a DRAM die) and comprising integrated circuit devices for a desired functionality. In an embodiment the fourth semiconductor device 1309 is designed to work in conjunction with or concurrently with the first semiconductor device 201 and/or the third semiconductor device 1307.

The fourth semiconductor device 1309 may be bonded to the third semiconductor device 1307. In an embodiment the fourth semiconductor device 1309 is only physically bonded with the third semiconductor device 1307, such as by using an adhesive. In this embodiment the fourth semiconductor device 1309 and the third semiconductor device 1307 may be electrically connected to the third substrate 1305 using, e.g., wire bonds 1319, although any suitable electrical bonding may be alternatively be utilized.

Alternatively, the fourth semiconductor device 1309 may be bonded to the third semiconductor device 1307 both physically and electrically. In this embodiment the fourth semiconductor device 1309 may comprise fourth external connections (not separately illustrated in FIG. 13) that connect with fifth external connections (also not separately illustrated in FIG. 13) on the third semiconductor device 1307 in order to interconnect the fourth semiconductor device 1309 with the third semiconductor device 1307.

The third contact pads 1311 may be formed on the third substrate 1305 to form electrical connections between the third semiconductor device 1307 and, e.g., the fourth external connections 1315. In an embodiment the third contact pads 1311 may be formed over and in electrical contact with electrical routing (such as through substrate vias 1317) within the third substrate 1305. The third contact pads 1311 may comprise aluminum, but other materials, such as copper, may alternatively be used. The third contact pads 1311 may be formed using a deposition process, such as sputtering, to form a layer of material (not shown) and portions of the layer of material may then be removed through a suitable process (such as photolithographic masking and etching) to form the third contact pads 1311. However, any other suitable process may be utilized to form the third contact pads 1311. The third contact pads 1311 may be formed to have a thickness of between about 0.5 μm and about 4 μm, such as about 1.45 μm.

The second encapsulant 1313 may be used to encapsulate and protect the third semiconductor device 1307, the fourth semiconductor device 1309, and the third substrate 1305. In an embodiment the second encapsulant 1313 may be a molding compound and may be placed using a molding device (not illustrated in FIG. 13). For example, the third substrate 1305, the third semiconductor device 1307, and the fourth semiconductor device 1309 may be placed within a cavity of the molding device, and the cavity may be hermetically sealed. The second encapsulant 1313 may be placed within the cavity either before the cavity is hermetically sealed or else may be injected into the cavity through an injection port. In an embodiment the second encapsulant 1313 may be a molding compound resin such as polyimide, PPS, PEEK, PES, a heat resistant crystal resin, combinations of these, or the like.

Once the second encapsulant 1313 has been placed into the cavity such that the second encapsulant 1313 encapsulates the region around the third substrate 1305, the third semiconductor device 1307, and the fourth semiconductor device 1309, the second encapsulant 1313 may be cured in order to harden the second encapsulant 1313 for optimum protection. While the exact curing process is dependent at least in part on the particular material chosen for the second encapsulant 1313, in an embodiment in which molding compound is chosen as the second encapsulant 1313, the curing could occur through a process such as heating the second encapsulant 1313 to between about 100° C. and about 130° C., such as about 125° C. for about 60 sec to about 3000 sec, such as about 600 sec. Additionally, initiators and/or catalysts may be included within the second encapsulant 1313 to better control the curing process.

However, as one having ordinary skill in the art will recognize, the curing process described above is merely an exemplary process and is not meant to limit the current embodiments. Other curing processes, such as irradiation or even allowing the second encapsulant 1313 to harden at ambient temperature, may alternatively be used. Any suitable curing process may be used, and all such processes are fully intended to be included within the scope of the embodiments discussed herein.

In an embodiment the fourth external connections 1315 may be formed to provide an external connection between the third substrate 1305 and, e.g., the backside ball pads 1301. The fourth external connections 1315 may be contact bumps such as microbumps or controlled collapse chip connection (C4) bumps and may comprise a material such as tin, or other suitable materials, such as silver or copper. In an embodiment in which the fourth external connections 1315 are tin solder bumps, the fourth external connections 1315 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Once the fourth external connections 1315 have been formed, the fourth external connections 1315 are aligned with and placed into physical contact with the backside ball pads 1301, and a bonding is performed. For example, in an embodiment in which the fourth external connections 1315 are solder bumps, the bonding process may comprise a reflow process whereby the temperature of the fourth external connections 1315 is raised to a point where the fourth external connections 1315 will liquefy and flow, thereby bonding the first package 1300 to the backside ball pads 1301 once the fourth external connections 1315 resolidifies.

FIG. 13 additionally illustrates the bonding of a second package 1321 to the backside ball pads 1301. In an embodiment the second package 1321 may be similar to the first package 1300, and may be bonded to the backside ball pads 1301 utilizing similar processes. However, the second package 1321 may also be different from the first package 1300.

Figure 14:
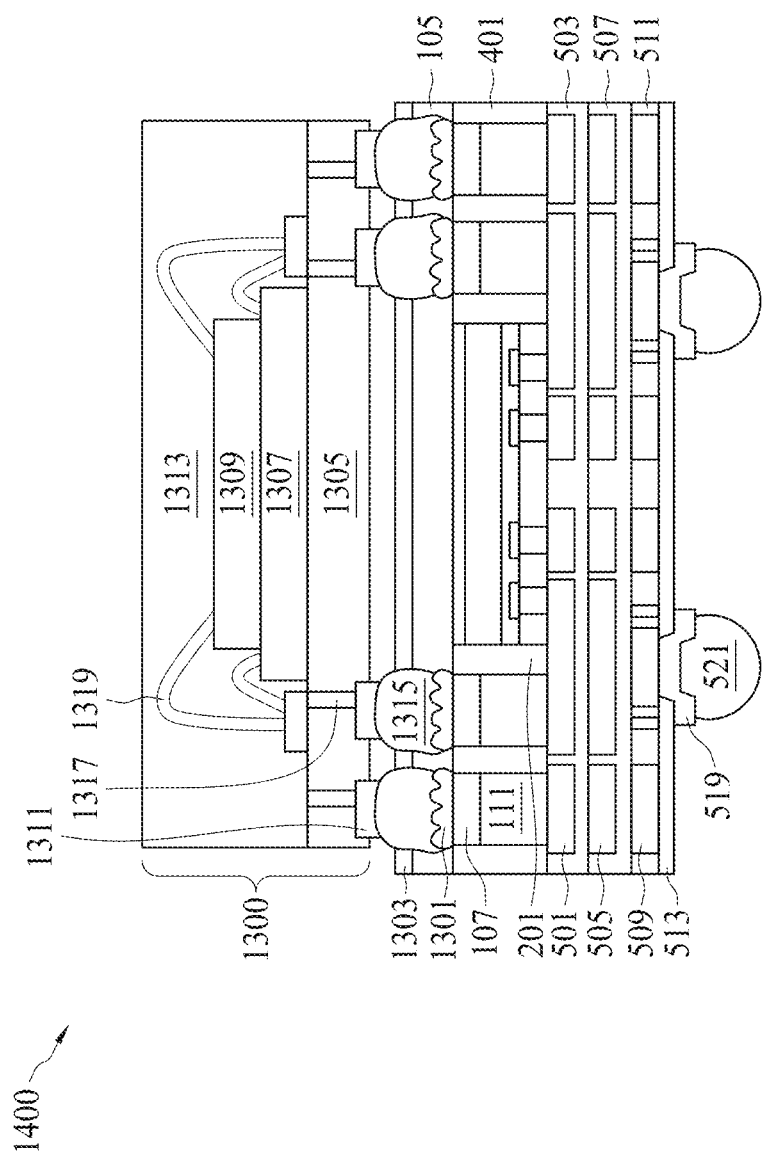
FIG. 14 illustrates a singulation process in accordance with some embodiments.

FIG. 14 illustrates a debonding of the third external connection 521 from the ring structure 1201 and a singulation of the structure to form a first integrated fan out package-on-package (InFO-POP) structure 1400. In an embodiment the third external connection 521 may be debonded from the ring structure 1201 by initially bonding the first package 1300 and the second package 1321 to a second ring structure using, e.g., a second ultraviolet tape. Once bonded, the ultraviolet tape 1203 may be irradiated with ultraviolet radiation and, once the ultraviolet tape 1203 has lost its adhesiveness, the third external connection 521 may be physically separated from the ring structure 1201.

Once debonded, a singulation of the structure to form the first InFO-POP structure 1400 is performed. In an embodiment the singulation may be performed by using a saw blade (not shown) to slice through the encapsulant 401 and the polymer layer 105 between the vias 111, thereby separating one section from another to form the first InFO-POP structure 1400 with the first semiconductor device 201. However, as one of ordinary skill in the art will recognize, utilizing a saw blade to singulate the first InFO-POP structure 1400 is merely one illustrative embodiment and is not intended to be limiting. Alternative methods for singulating the first InFO-POP structure 1400, such as utilizing one or more etches to separate the first InFO-POP structure 1400, may alternatively be utilized. These methods and any other suitable methods may alternatively be utilized to singulate the first InFO-POP structure 1400.

By forming the landing pad 517 of the third redistribution layer 509 of the first InFO-POP structure 1400 with the mesh holes 701 as described herein, a more reliable device may be obtained. In particular, by forming the mesh holes 701 as described in any of the embodiments herein, the landing pad 517 will be able to handle sidewall stresses that can occur during thermal cycling of testing, manufacturing, and operating processes. As such, delamination, peeling, and cracking that may otherwise be caused by these stresses may be reduced or eliminating, allowing for larger yields and more reliable devices.

In accordance with an embodiment, a semiconductor device comprising a first redistribution layer over a semiconductor device and vias is provided. The vias are separated from the semiconductor device by an encapsulant, and the first redistribution layer comprises a landing pad region with conductive material, wherein each portion of the landing pad region is electrically connected to each other portion of the landing pad region. A plurality of mesh holes are within the landing pad, wherein individual ones of the plurality of mesh holes are surrounded by the conductive material.

In accordance with another embodiment, a semiconductor device comprising a redistribution layer with a landing pad over a substrate, the landing pad having a circular shape, is provided. A plurality of dielectric plugs extend through the landing pad, wherein the plurality of dielectric plugs are arranged in a circular pattern. A passivation layer over the redistribution layer and covering the plurality of dielectric plugs. An opening is through the passivation layer, wherein the opening exposes a portion of the landing pad. An underbump metallization is in physical contact with the exposed portion of the landing pad, the underbump metallization being over each of the plurality of dielectric plugs.

In accordance with yet another embodiment, a method of manufacturing a semiconductor device comprising encapsulating a semiconductor device and a via with an encapsulant, wherein after the encapsulating the via is separated from the semiconductor device by the encapsulant is provided. A redistribution layer is formed over the via and the semiconductor device, the redistribution layer comprising a landing pad with a circular shape and a plurality of mesh openings within the landing pad, wherein the plurality of mesh openings are arranged in a circular pattern. A first passivation layer is formed covering the plurality of mesh openings, and portions of the first passivation layer are removed to form an opening through the first passivation layer, wherein the removing the portions exposes a portion of the landing pad. An underbump metallization is formed in physical contact with the exposed portion of the landing pad, the underbump metallization being over each of the plurality of mesh openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a redistribution layer over a semiconductor device, an encapsulant, and a via, wherein the via extends from a first side of the encapsulant to a second side of the encapsulant and wherein the via is separated from the semiconductor device by the encapsulant;
   forming a circular arrangement of a plurality of dielectric plugs through a landing pad region of the redistribution layer;
   depositing a passivation layer over each of the plurality of dielectric plugs;
   removing a portion of the passivation layer to expose a conductive portion of the landing pad region; and
   depositing an underbump metallization over each of the plurality of dielectric plugs and through the passivation layer to make contact with the conductive portion of the landing pad region.

2. The method of claim 1, wherein the forming the circular arrangement of the plurality of dielectric plugs comprises:
   removing portions of the redistribution layer to form openings; and
   filling the openings with a dielectric material.

3. The method of claim 1, wherein the forming the circular arrangement of the plurality of dielectric plugs comprises:
   forming a conductive material within a photosensitive material; and
   replacing at least a portion of the photosensitive material with a dielectric material.

4. The method of claim 1, wherein the landing pad region has a first radius of between 210 μm and about 240 μm.

5. The method of claim 1, wherein the circular arrangement of the plurality of dielectric plugs comprises a discontinuous circle.

6. The method of claim 5, wherein the discontinuous circle has an inner radius of about 120 μm and about 190 μm.

7. The method of claim 1, wherein a first one of the plurality of dielectric plugs is separated from a second one of the plurality of dielectric plugs by a distance of between about 10 μm and about 50 μm.

8. The method of claim 1, wherein removing the portion of the passivation layer to expose a conductive portion of the landing pad region does not remove portions of the passivation layer over each of the plurality of dielectric plugs.

9. A method of manufacturing a semiconductor device, the method comprising:
   depositing a dielectric material into a landing pad region of a redistribution layer, the dielectric material forming a dielectric mesh in a circular pattern surrounding an area of the landing pad region, wherein the redistribution layer is located over a semiconductor device separated from a through via by an encapsulant; and
   depositing an underbump metallization over the landing pad region, wherein the underbump metallization is in physical contact with the area of the landing pad region but is separated from the dielectric mesh by a passivation layer.

10. The method of claim 9, further comprising, prior to the depositing the dielectric material:
    forming the through via on a carrier substrate;
    placing the semiconductor device on the carrier substrate;
    encapsulating the semiconductor device and the through via; and
    planarizing the encapsulant to expose the through via and the semiconductor device.

11. The method of claim 9, wherein the underbump metallization has a sidewall that is directly over a portion of the landing pad region.

12. The method of claim 9, further comprising attaching an external connector to the through via, the external connector being located on an opposite side of the through via from the redistribution layer.

13. The method of claim 12, further comprising attaching a first package to the external connector.

14. The method of claim 9, wherein the underbump metallization has a radius of between about 180 μm and about 230 μm.

15. The method of claim 9, wherein the dielectric mesh comprises a dielectric plug with a square shape.

16. A method of manufacturing a semiconductor device, the method comprising:
    encapsulating a semiconductor device and a via with an encapsulant, wherein after the encapsulating the via is separated from the semiconductor device by the encapsulant;
    forming a redistribution layer over the via and the semiconductor device, the redistribution layer comprising a landing pad with a circular shape and a plurality of mesh openings within the landing pad, wherein the plurality of mesh openings are arranged in a circular pattern;
    forming a first passivation layer covering the plurality of mesh openings;
    removing portions of the first passivation layer to form an opening through the first passivation layer, wherein the removing the portions exposes a conductive portion of the landing pad that extends through a middle of the landing pad from a first side of the opening to a second side of the opening, the second side being the furthest from the first side; and
    forming an underbump metallization in physical contact with the exposed portion of the landing pad, the underbump metallization being over each of the plurality of mesh openings.

17. The method of claim 16, wherein a first radius of the circular shape of the landing pad is greater than a second radius of the circular pattern of the plurality of mesh openings, wherein the second radius is an outer radius of the circular pattern.

18. The method of claim 17, wherein the underbump metallization has a third radius that is larger than the second radius.

19. The method of claim 18, wherein the third radius is smaller than the first radius.

20. The method of claim 19, wherein a fourth radius is an inner radius of the circular pattern and the opening has a fifth radius that is less than the fourth radius.

21. The method of claim 16, wherein the plurality of mesh openings are formed at a same time as the landing pad.

22. The method of claim 16, wherein after the opening is formed, second portions of the first passivation layer remain, the second portions of the first passivation layer at least partially covering the plurality of mesh openings.

* * * * *